United States Patent
Fuller et al.

(10) Patent No.: US 9,494,255 B2
(45) Date of Patent: Nov. 15, 2016

(54) PLATE MICROVALVE WITH IMPROVED SEALING MECHANISM

(71) Applicant: DunAn Microstaq, Inc., Austin, TX (US)

(72) Inventors: Edward Nelson Fuller, Manchester, MI (US); Parthiban Arunasalam, Austin, TX (US); Chen Yang, Austin, TX (US); Joe A. Ojeda, Sr., Austin, TX (US); Gengxun K. Gurley, Hutto, TX (US)

(73) Assignee: DunAn Microstaq, Inc., Austin, TX (US)

( * ) Notice: Subject to any disclaimer, the term of this patent is extended or adjusted under 35 U.S.C. 154(b) by 0 days.

(21) Appl. No.: 14/743,088

(22) Filed: Jun. 18, 2015

(65) Prior Publication Data

US 2016/0047489 A1    Feb. 18, 2016

Related U.S. Application Data

(60) Provisional application No. 62/037,321, filed on Aug. 14, 2014.

(51) Int. Cl.
| | |
|---|---|
| F16K 99/00 | (2006.01) |
| B01L 3/00 | (2006.01) |
| B81B 1/00 | (2006.01) |

(52) U.S. Cl.
CPC .......... *F16K 99/0011* (2013.01); *B01L 3/5027* (2013.01); *B81B 1/00* (2013.01); *Y10T 137/2224* (2015.04)

(58) Field of Classification Search
CPC .... F16K 99/0011; B81B 1/00; B01L 3/5027; Y10T 137/2224
See application file for complete search history.

(56) References Cited

U.S. PATENT DOCUMENTS

| | | | | |
|---|---|---|---|---|
| 6,390,781 B1 * | 5/2002 | McDonough | ........ | A61H 33/005 210/86 |
| 7,011,378 B2 * | 3/2006 | Maluf | ................... | B81B 3/0024 137/14 |
| 7,210,502 B2 * | 5/2007 | Fuller | ................. | F04B 27/1804 137/596.16 |
| 7,438,030 B1 * | 10/2008 | Okojie | ................ | F16K 99/0001 123/90.11 |
| 8,011,388 B2 * | 9/2011 | Fuller | ................. | F16K 99/0001 137/625.65 |
| 8,136,616 B2 | 3/2012 | Padilla et al. | | |
| 8,393,344 B2 | 3/2013 | Hunnicutt | | |
| 8,662,468 B2 | 3/2014 | Hunnicutt | | |

(Continued)

*Primary Examiner* — Craig Schneider
*Assistant Examiner* — Kevin Barss
(74) *Attorney, Agent, or Firm* — MacMillan, Sobanski & Todd, LLC (57) ABSTRACT

A microvalve includes a first plate having a surface, a recessed region provided within the surface, a fluid port provided within the recessed region, and a sealing structure extending about the fluid port. A second plate defines a non-movable portion and a movable portion, a surface of the non-movable portion abutting the surface of the first plate, the non-movable portion having first and second openings formed therethrough. The movable portion is formed within the first opening and has an axis, the movable portion defining a displaceable member connected to the non-movable portion by a convoluted spring formed in a second opening. The displaceable member is slidingly and axially movable within the first opening between a closed position, wherein the displaceable member cooperates with the sealing structure to prevent fluid communication through the fluid port, and an opened position, wherein the displaceable member does not cooperate with at least a portion of the sealing structure to prevent fluid communication through the fluid port.

17 Claims, 10 Drawing Sheets

(56) References Cited

U.S. PATENT DOCUMENTS

| | | |
|---|---|---|
| 9,140,613 B2 | 9/2015 | Arunasalam et al. |
| 9,328,850 B2 * | 5/2016 | Fuller ................. F16K 99/0021 |
| 2014/0374633 A1 | 12/2014 | Fuller et al. |
| 2015/0047345 A1 | 2/2015 | Eves et al. |
| 2015/0352604 A1 | 12/2015 | Arunasalam et al. |
| 2016/0047490 A1 * | 2/2016 | Fuller ................. F16K 99/0011 251/327 |

* cited by examiner

FIG. 12

PLATE MICROVALVE WITH IMPROVED SEALING MECHANISM

CROSS REFERENCE TO RELATED APPLICATIONS

This application claims the benefit of U.S. Provisional Application No. 62/037,321 filed Aug. 14, 2014, the disclosure of which is incorporated herein by reference.

BACKGROUND OF THE INVENTION

This invention relates in general to microvalves for controlling the flow of fluid through a fluid circuit. In particular, this invention relates to an improved structure for a plate microvalve that resists interference with the free movement of a displaceable member of the plate microvalve that might otherwise result from the presence of particulate contaminants contained in the fluid flowing therethrough.

Generally speaking, a micro-electro-mechanical system is a system that not only includes both electrical and mechanical components, but is additionally physically small, typically including features having sizes in the range of ten micrometers or smaller. The term "micro-machining" is commonly understood to relate to the production of three-dimensional structures and moving parts of such micro-electro-mechanical system devices. In the past, micro-electro-mechanical systems used modified integrated circuit (e.g., computer chip) fabrication techniques (such as chemical etching) and materials (such as silicon semiconductor material), which were micro-machined to provide these very small electrical and mechanical components. More recently, however, other micro-machining techniques and materials have become available.

As used herein, the term "micro-machined device" means a device including features having sizes in the micrometer range or smaller and, thus, is at least partially formed by micro-machining. As also used herein, the term "microvalve" means a valve including features having sizes in the micrometer range or smaller and, thus, is also at least partially formed by micro-machining. Lastly, as used herein, the term "microvalve device" means a micro-machined device that includes not only a microvalve, but further includes additional components. It should be noted that if components other than a microvalve are included in the microvalve device, these other components may be either micro-machined components or standard-sized (i.e., larger) components. Similarly, a micro-machined device may include both micro-machined components and standard-sized components.

A variety of microvalve structures are known in the art for controlling the flow of fluid through a fluid circuit. One well known microvalve structure includes a displaceable member that is supported within a closed internal cavity provided in a valve body for pivoting, axial, or other movement between a closed position and an opened position. When disposed in the closed position, the displaceable member substantially blocks a first fluid port that is otherwise in fluid communication with a second fluid port, thereby preventing fluid from flowing between the first and second fluid ports. When disposed in the opened position, the displaceable member does not substantially block the first fluid port from fluid communication with the second fluid port, thereby permitting fluid to flow between the first and second fluid ports.

In this conventional microvalve structure, the thickness of the closed internal cavity is usually only slightly larger than the thickness of the displaceable member disposed therein. Thus, relatively small spaces are provided between the displaceable member and the adjacent portions of the microvalve that define the closed internal cavity. This is done so as to minimize the amount of undesirable leakage therethrough when the displaceable member is disposed in the closed position. However, it has been found that when this conventional microvalve structure is used to control the flow of fluid containing solid particles (such as particulate contaminants that may be contained within the fluid), such particles may become jammed between the displaceable member and the adjacent portions of the microvalve that define the closed internal cavity. The jamming of such particles can, in some instances, undesirably interfere with the free movement of the displaceable member between the closed and opened positions. Thus, it would be desirable to provide an improved structure for a microvalve that resists interference with the free movement of a displaceable member of the microvalve that might otherwise result from the presence of particulate contaminants contained in the fluid flowing therethrough.

SUMMARY OF THE INVENTION

This invention relates to an improved structure for a microvalve that resists interference with the free movement of a displaceable member of the microvalve that might otherwise result from the presence of particulate contaminants contained in the fluid flowing therethrough. The microvalve includes a first plate having a surface, a recessed region provided within the surface, a fluid port provided within the recessed region, and a sealing structure extending about the fluid port. A second plate defines a non-movable portion and a movable portion, a surface of the non-movable portion abutting the surface of the first plate, the non-movable portion having first and second openings formed therethrough. The movable portion is formed within the first opening and has an axis, the movable portion defining a displaceable member connected to the non-movable portion by a convoluted spring formed in a second opening. The displaceable member is slidingly and axially movable within the first opening between a closed position, wherein the displaceable member cooperates with the sealing structure to prevent fluid communication through the fluid port, and an opened position, wherein the displaceable member does not cooperate with at least a portion of the sealing structure to prevent fluid communication through the fluid port.

Various aspects of this invention will become apparent to those skilled in the art from the following detailed description of the preferred embodiments, when read in light of the accompanying drawings.

DETAILED DESCRIPTION OF THE PREFERRED EMBODIMENTS

Figure 1:
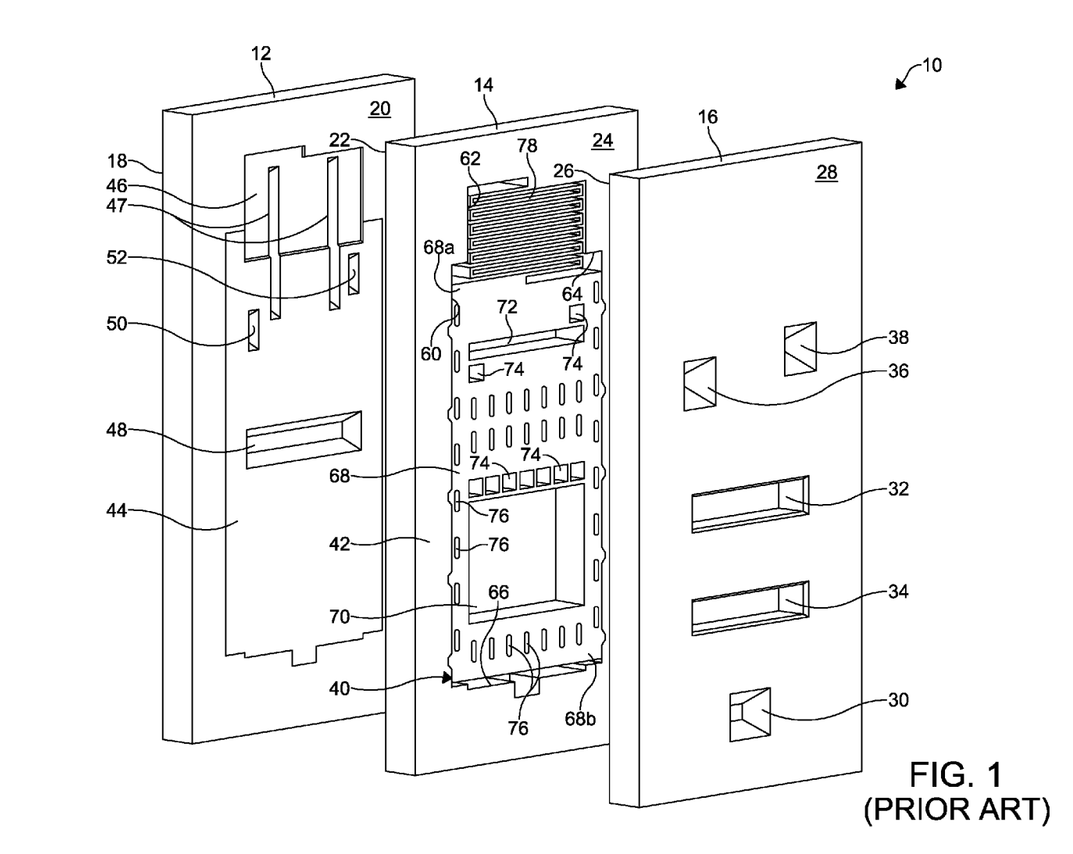
FIG. 1 is an exploded perspective view of a known pilot operated plate microvalve.
Figure 2:
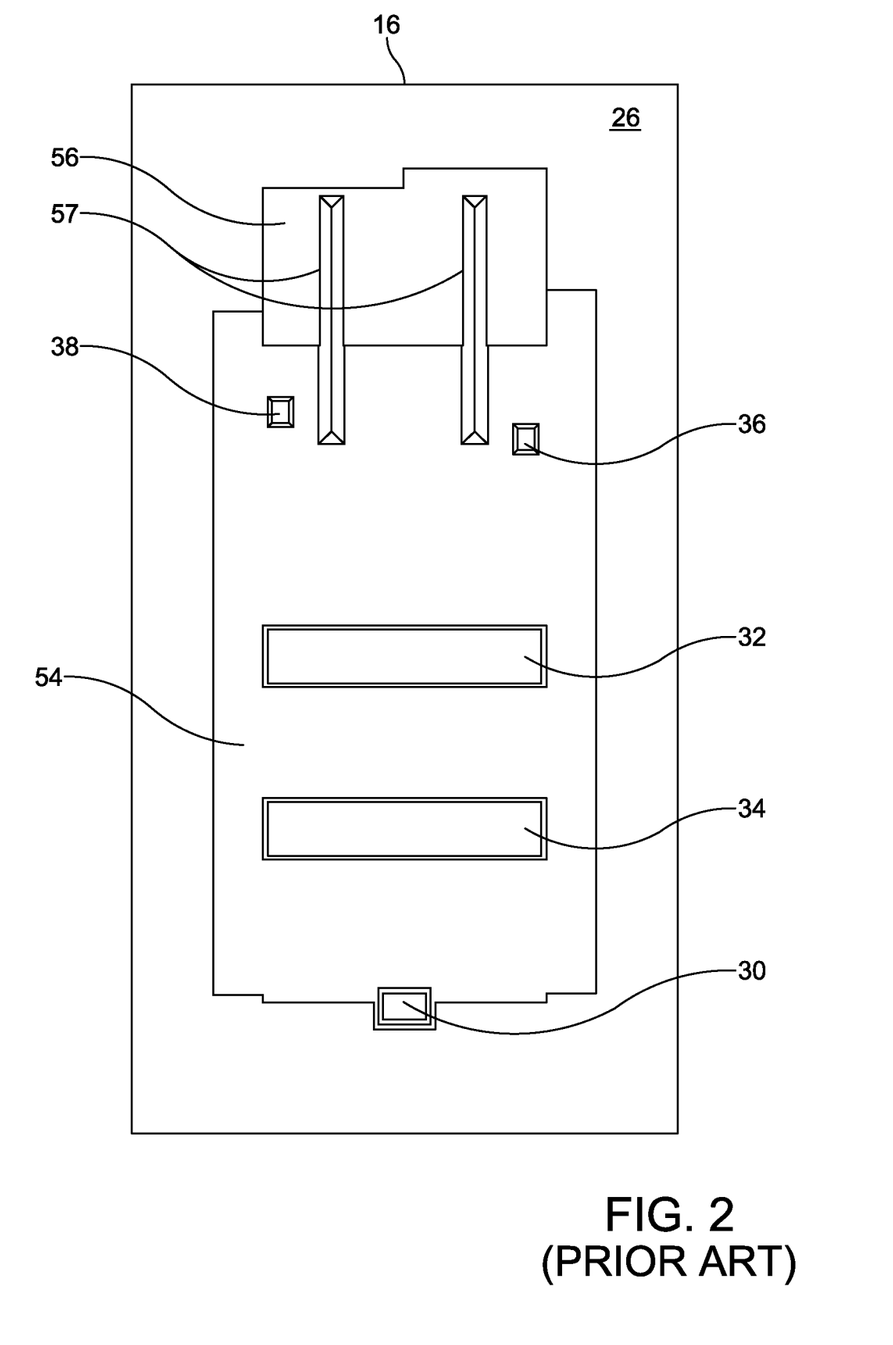
FIG. 2 is a plan view of an inner surface of the base plate illustrated in FIG. 1.
Figure 3:
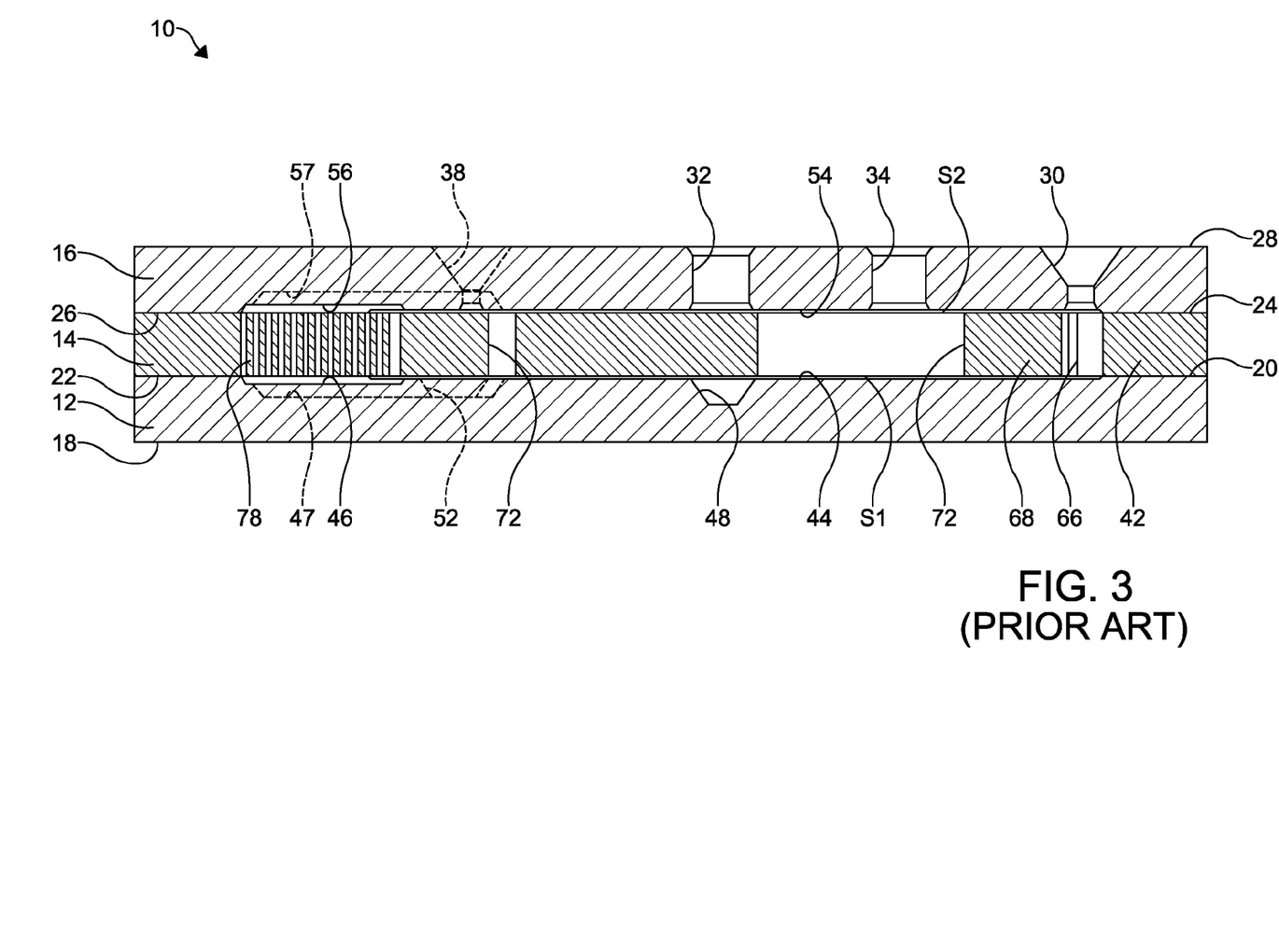
FIG. 3 is a sectional elevational view of the microvalve illustrated in FIG. 1 shown assembled.

Referring now to the drawings, an embodiment of a known microvalve is indicated generally at 10 in FIGS. 1 through 3. The illustrated microvalve 10 is a pilot operated plate microvalve, similar to the embodiments of the microvalve disclosed in U.S. Pat. No. 8,393,344 to Hunnicutt, the disclosure of which in incorporated herein in its entirety.

As shown in FIG. 1, the microvalve 10 includes a cover plate 12, an intermediate plate 14, and a base plate 16. The cover plate 12 has an outer surface 18 and an inner surface 20. The intermediate plate 14 has a first surface 22 and a second surface 24 and defines a movable portion 40 and a non-movable portion 42. The base plate 16 has an inner surface 26 and an outer surface 28. The base plate 16 also has a command port 30, an input port 32, an output port 34, a reference inlet port 36, and a reference outlet port 38 formed therethrough.

When the microvalve 10 is assembled as shown in FIG. 3, the inner surface 20 of the cover plate 12 engages the first surface 22 of the non-movable portion 42 of the intermediate plate 14, and the inner surface 26 of the base plate 16 engages the second surface 24 of the non-movable portion 42 of the intermediate plate 14. The cover plate 12, the intermediate plate 14, and the base plate 16 may be retained in this orientation in any desired manner.

The structure of the inner surface 20 of the cover plate 12 is illustrated in FIG. 1. As shown therein, the cover plate 12 includes a first recessed region 44, a second recessed region 46, and two feedback trenches 47 connecting the first and second recessed regions 44 and 46. First, second, and third pressure equalization troughs, 48, 50, and 52, respectively, are formed the inner surface 20 within the first recessed region 44.

The structure of the inner surface 26 of the base plate 16 is illustrated in FIG. 2. As shown therein, the base plate 16 includes a first recessed region 54, a second recessed region 56, and two feedback trenches 57 connecting the first and second recessed regions 54 and 56. The command port 30, the input port 32, the output port 34, the reference inlet port 36, and the reference outlet port 38 are formed the inner surface 26 within the first recessed region 54.

The structure of the intermediate plate 14 is illustrated in detail in FIG. 1. As shown therein, a wide and preferably rectangular plate opening 60 and an adjacent and also preferably rectangular spring opening 62 are formed in the intermediate plate 14. The spring opening 62 is preferably narrower than the plate opening 60. The plate opening 60 and the spring opening 62 are in fluid communication with each other.

The plate opening 60 has a first end 64 which is adjacent and in fluid communication with the spring opening 62. The plate opening 60 also has a second end 66 opposite the first end 64.

The intermediate plate 14 further includes a displaceable member or plate 68 disposed in the plate opening 60 between the first and second ends 64 and 66 of the plate opening 60. The displaceable plate 68 is movable between a first position adjacent the second end 66 of the plate opening 60, as shown in FIG. 1, and a second position (not shown) adjacent the first end 64 of the plate opening 60.

The displaceable plate 68 is generally rectangular and has a first or command end 68a disposed nearest the first end 64 of the plate opening 60. The displaceable plate 68 has a second or reference end 68b disposed nearest the second end 66 of the plate opening 60.

The displaceable plate 68 has first and second fluid openings 70 and 72 formed therethrough. Pressure balancing ports 74 and 76 are also formed through the displaceable plate 68.

The intermediate plate 14 also includes a convoluted spring 78, disposed in the spring opening 62. The convoluted spring 78 moveably connects the non-movable portion 42 of the intermediate plate 14 to the displaceable plate 68, and preferably biases the displaceable plate 68 to the first position. The convoluted spring 78 also retains the displaceable plate 68 in the plate opening 60.

As best shown in FIG. 3, a first relatively small space S1 is defined between the first recessed region 44 provided on the inner surface 20 of the cover plate 12 and the adjacent first surface 22 (the lower surface when viewing FIG. 3) of the displaceable plate 68. The thickness of this first relatively small space S1 has traditionally been about 3 μm in order to prevent excessive leakage through the microvalve 10.

Similarly, a second relatively small space S2 is defined between the first recessed region 54 provided on the inner surface 26 of the base plate 16 and the adjacent second surface 24 (the upper surface when viewing FIG. 1) of the displaceable plate 68. The thickness of this second relatively small space S2 has traditionally been about 3 μm in order to prevent excessive leakage through the microvalve 1.

In order to minimize leaking through the conventional microvalve 10 illustrated in FIGS. 1 through 3, it is desirable that the thicknesses of the relatively small spaces S1 and S2 be as small as possible. However, because the thicknesses of these relatively small spaces S1 and S2 are not only relatively small, but are constant throughout the entire surface area of the displaceable plate 68, then the likelihood increases that one or more particles (not shown) contained in the fluid leaking through such relatively small spaces S1 and S2 may become jammed therebetween. In other words, the particles may become jammed between either (1) the first recessed region 44 provided on the inner surface 20 of the cover plate 12 and the adjacent first surface 22 of the displaceable plate 68, or (2) the first recessed region 54 provided on the inner surface 26 of the base plate 16 and the adjacent second surface 24 of the displaceable plate 68.

FIGS. 4 through 12 illustrate portions of an improved microvalve, indicated generally at 100, in accordance with a first embodiment of this invention that minimizes the likelihood of such undesirable jamming. The illustrated microvalve 100 is a pilot operated plate microvalve that includes improved sealing structures, described in detail below.

Figure 4:
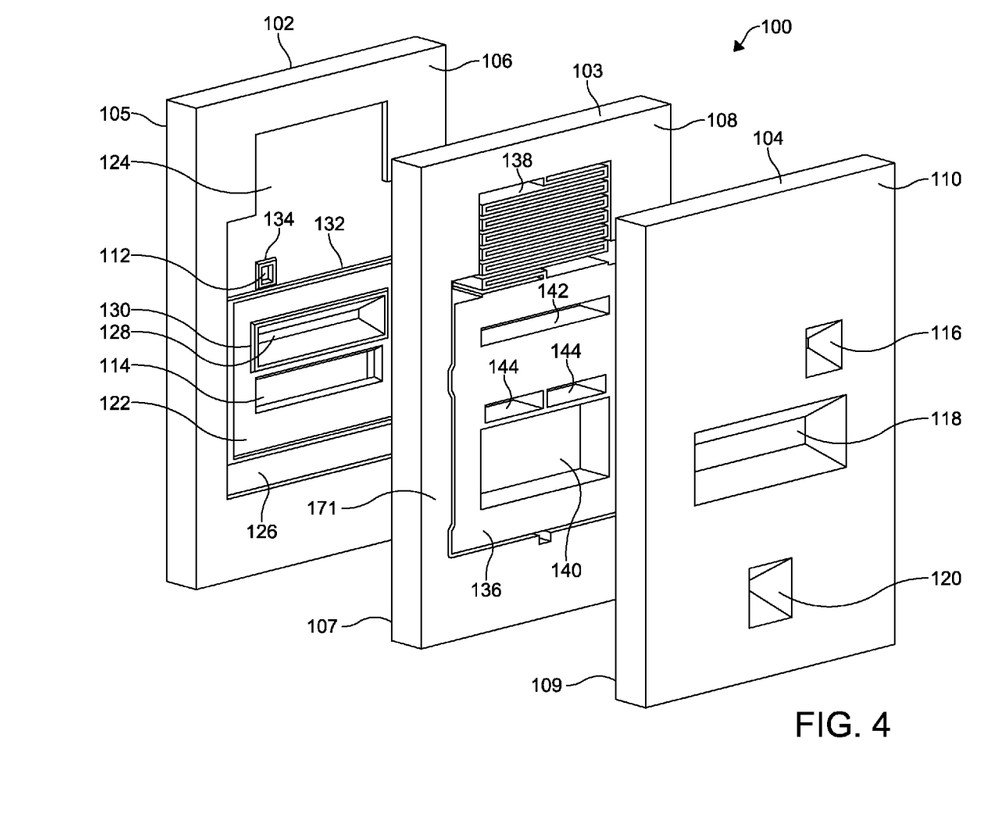
FIG. 4 is an exploded perspective view of an improved pilot operated plate microvalve in accordance with this invention.

As shown in FIG. 4, the microvalve 100 includes a cover plate 102, an intermediate plate 103, and a base plate 104. The cover plate 102 has an outer surface 105 and an inner surface 106. The cover plate 102 also has a first feedback port 112 and a pressure outlet port 114 formed therethrough. The intermediate plate 103 has a first surface 107 and a second surface 108. The base plate 104 has an inner surface 109 and an outer surface 110. The base plate 103 also has a second feedback port 116, a pressure inlet port 118, and a control port 120 formed therethrough.

When the microvalve 100 is assembled as shown in FIGS. 9 through 12, the inner surface 106 of the cover plate 102 engages the first surface 107 of a non-movable portion 171 of the intermediate plate 103, and the inner surface 109 of the base plate 104 engages the second surface 108 of the non-movable portion 171 of the intermediate plate 103. The cover plate 102, the intermediate plate 103, and the base plate 104 may be retained in this orientation in any desired manner. For example, portions of the cover plate 102 and/or the base plate 104 may be bonded to non-movable portions of the intermediate plate 103 by any of the methods described above for bonding the component plates of the microvalve 100. The cover plate 102, the intermediate plate 103, and the base plate 104 may be composed of any desired material or combination of materials, such as silicon, single crystal silicon, and/or similar materials.

Figure 7:
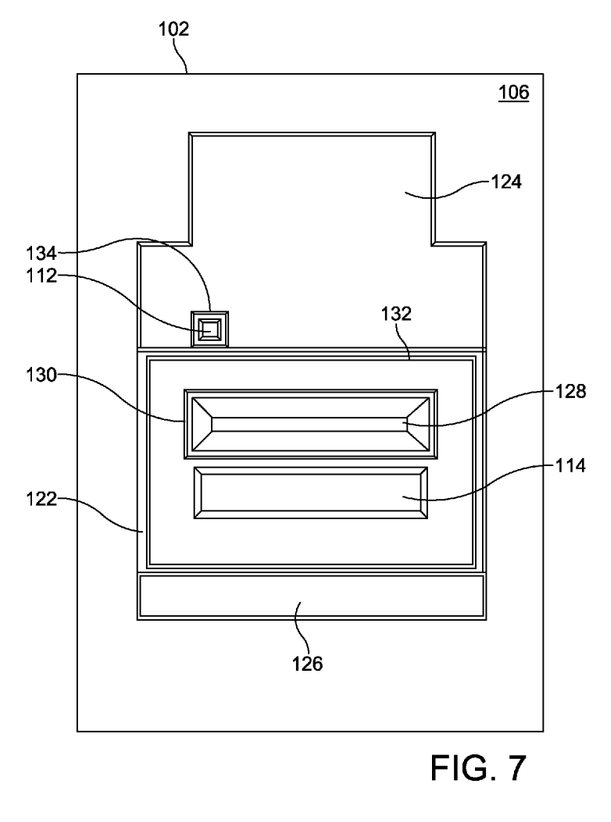
FIG. 7 is a plan view of an inner surface of the cover plate illustrated in FIG. 4.
Figure 8:
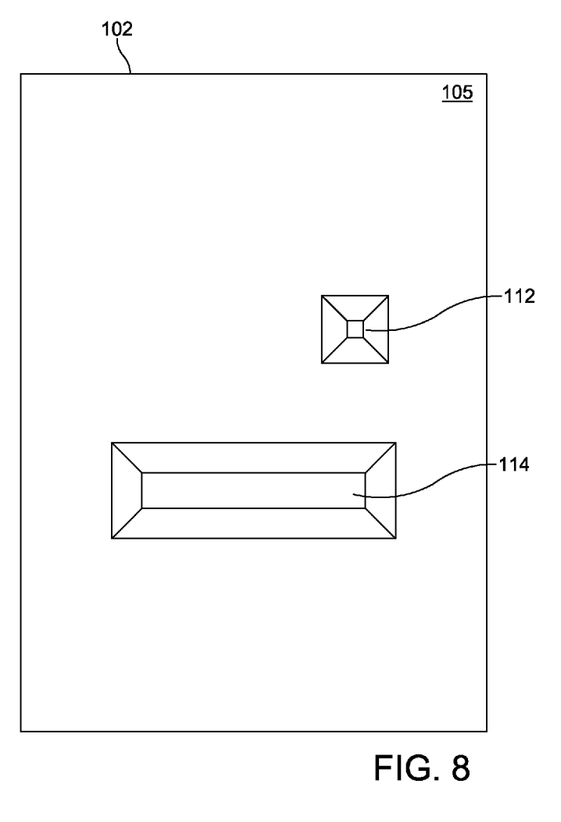
FIG. 8 is a plan view of an outer surface of the cover plate illustrated in FIG. 4.
Figure 9:
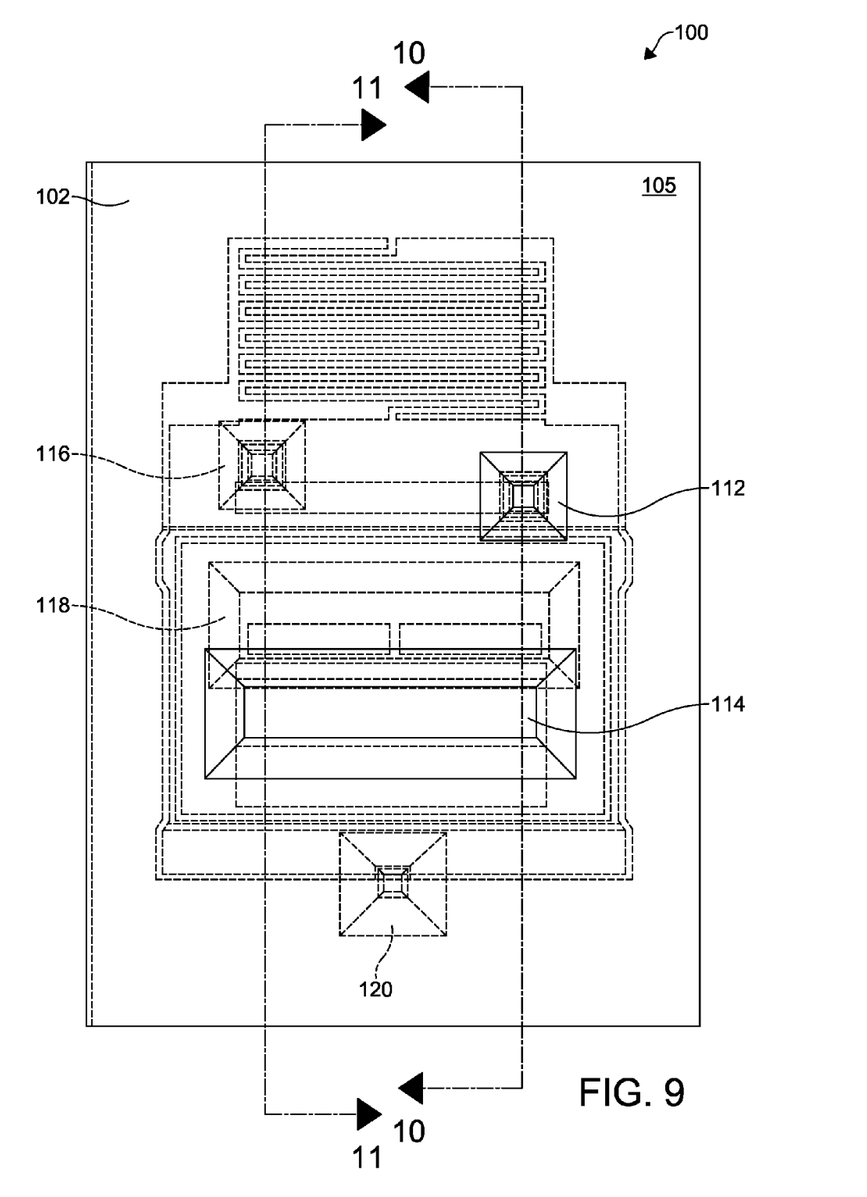
FIG. 9 is a plan view of the improved pilot operated plate microvalve illustrated in FIG. 4, showing the outer surface of the cover plate.

The structure of the inner surface 106 of the cover plate 102 is illustrated in detail in FIGS. 4 and 7. As shown therein, the cover plate 102 includes a first recessed region 122, a second recessed region 124, and a third recessed region 126 provided on the inner surface 106 thereof. The pressure outlet port 114 is formed through the first recessed region 122. A pressure equalization trough 128 is also formed the inner surface 106 within the first recessed region 122. The first feedback port 112 is formed through the second recessed region 124.

The cover plate 102 also includes a first sealing structure 130 that extends from the bottom surface of the first recessed region 122 and completely about the perimeter of the trough 128. A second sealing structure 132 also extends from the bottom surface of the first recessed region 122 and completely about a perimeter of the first recessed region 122. A third sealing structure 134 extends from the bottom surface of the second recessed region 124 and completely about the perimeter of the first feedback port 112.

Figure 10:
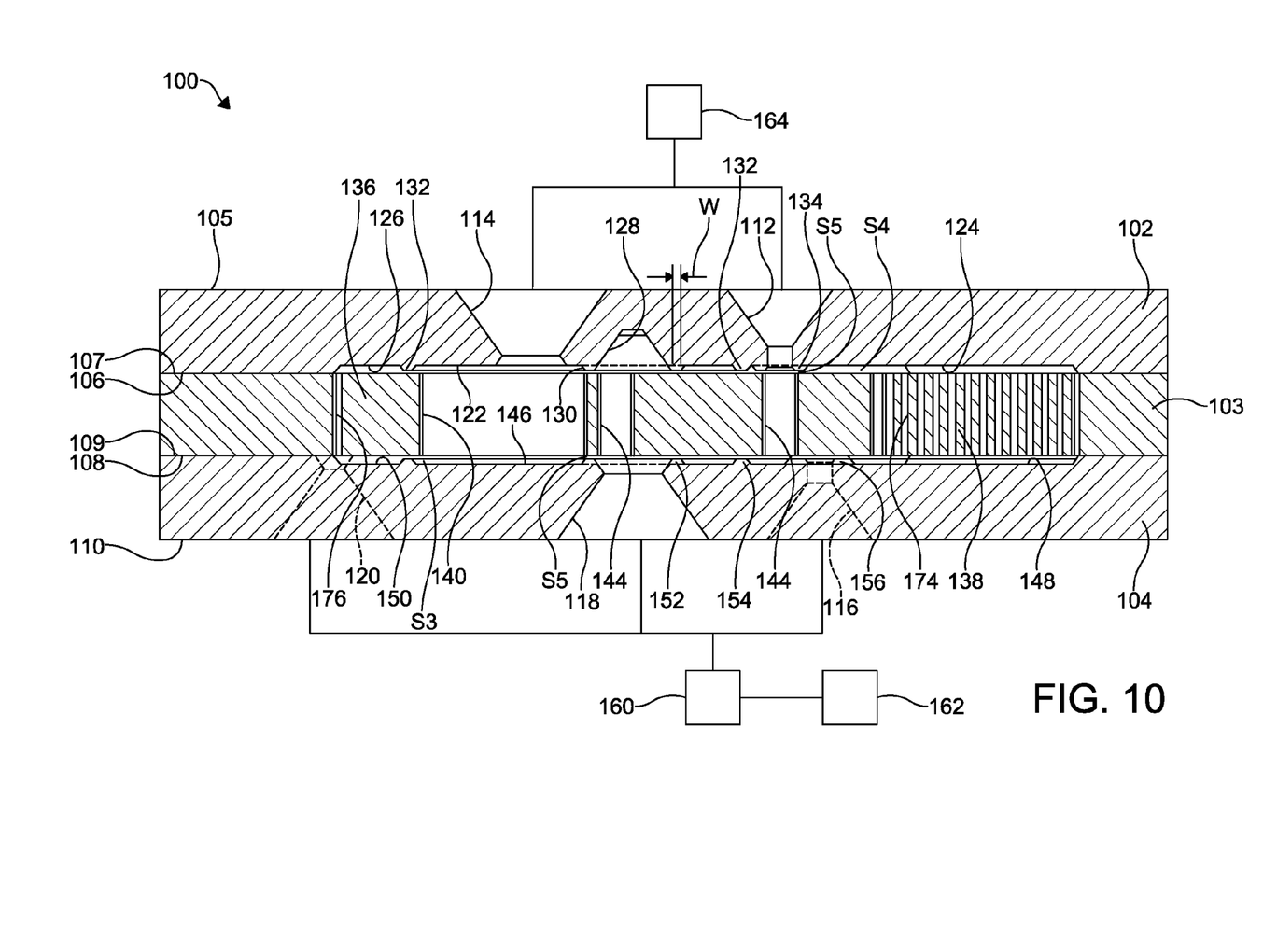
FIG. 10 is a sectional elevational view taken through the line 10-10 of FIG. 9 and showing the cover plate, the intermediate plate, and the base plate illustrated in FIGS. 4 through 9 assembled and in a closed position.
Figure 11:
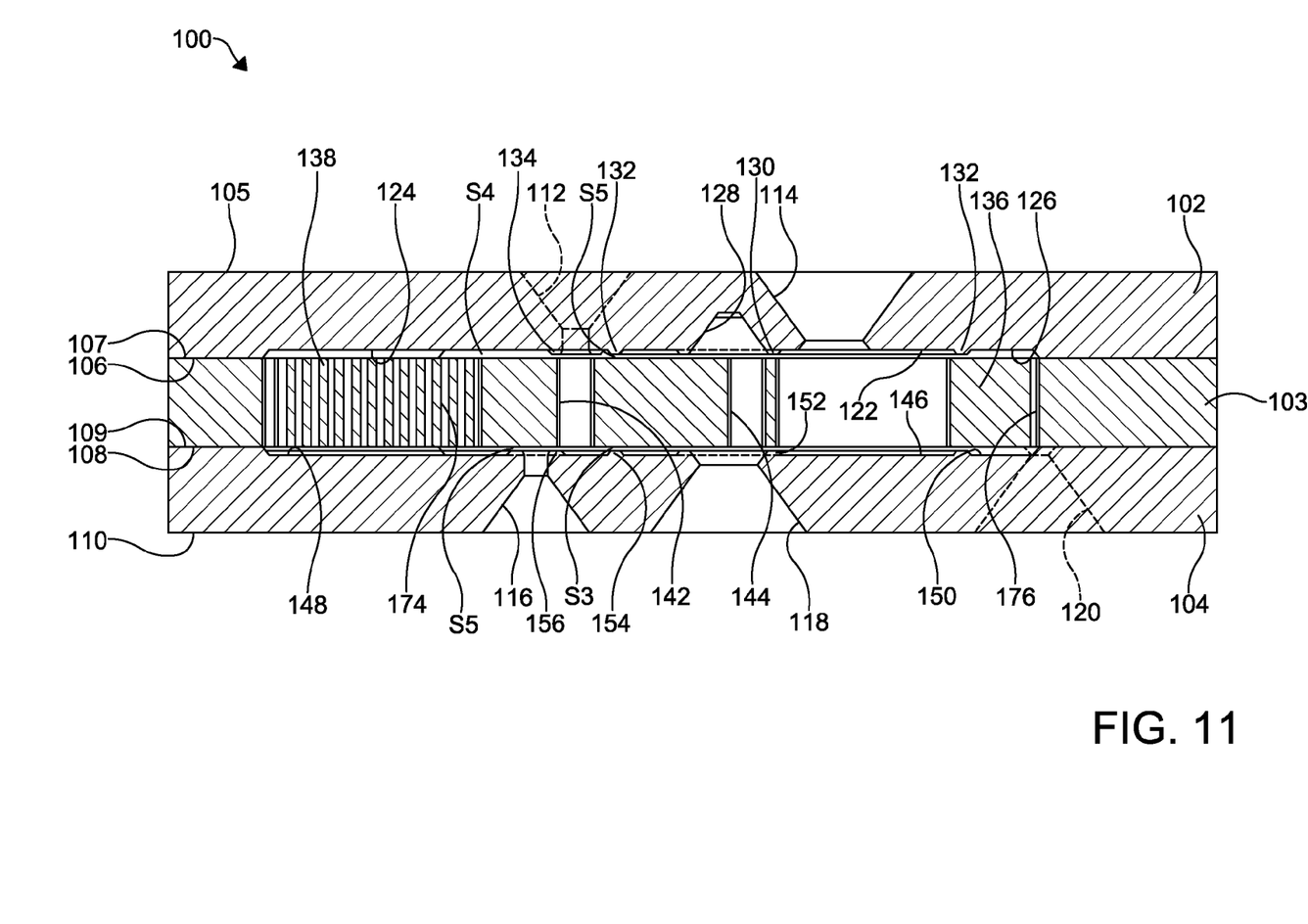
FIG. 11 is a sectional elevational view taken through the line 11-11 of FIG. 9.
Figure 12:
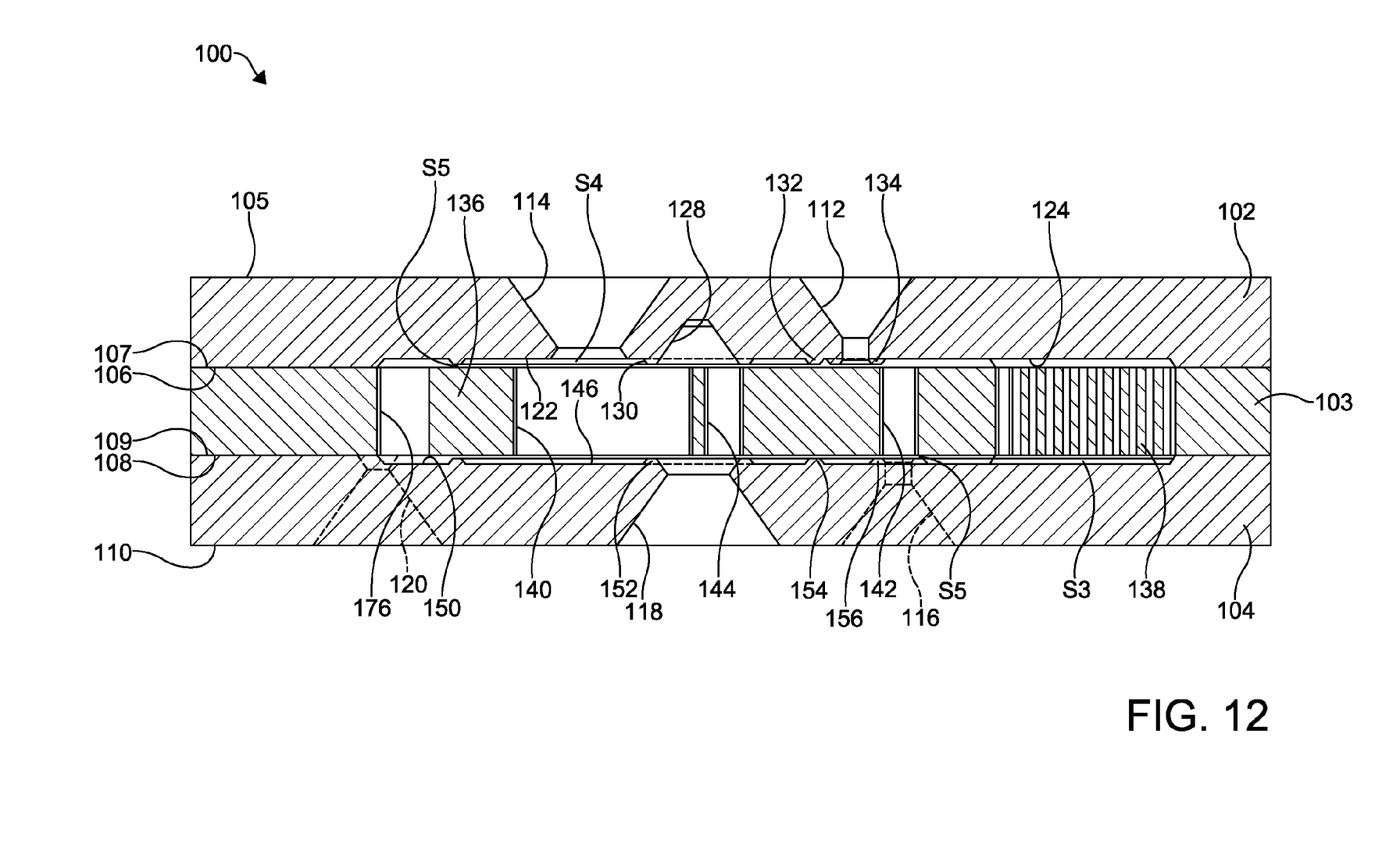
FIG. 12 is an alternate sectional elevational view taken through the line 10-10 of FIG. 9 and showing the cover plate, the intermediate plate, and the base plate illustrated in FIGS. 4 through 9 assembled and in an open position.

In the illustrated embodiment, each of the sealing structures 130, 132, and 134 is a wall that is generally trapezoidal in cross-sectional shape and has a width W at its top of about 70 μm, as shown in FIG. 10. Alternatively, the width W may be within the range of from about 40 μm to 120 μm. Each of the sealing structures 130, 132, and 134 includes four linearly-extending wall segments that extend adjacent to the four sides of the trough 128, the first recessed region 124, and the first feedback port 112, respectively. The sealing structures 130, 132, and 134 may however, be formed having any desired cross-sectional shape or combination of shapes, and may further extend in any desired manner (linearly or otherwise) about the trough 128, the first recessed region 124, and the first feedback port 112. For example, the sealing structures 130, 132, and 134 may be formed substantially as shown in FIGS. 10 through 12, but may have rounded corners between adjacent linearly-extending wall segments, have one or more non-linearly-extending wall segments, or be entirely non-linear in shape.

Figure 6:
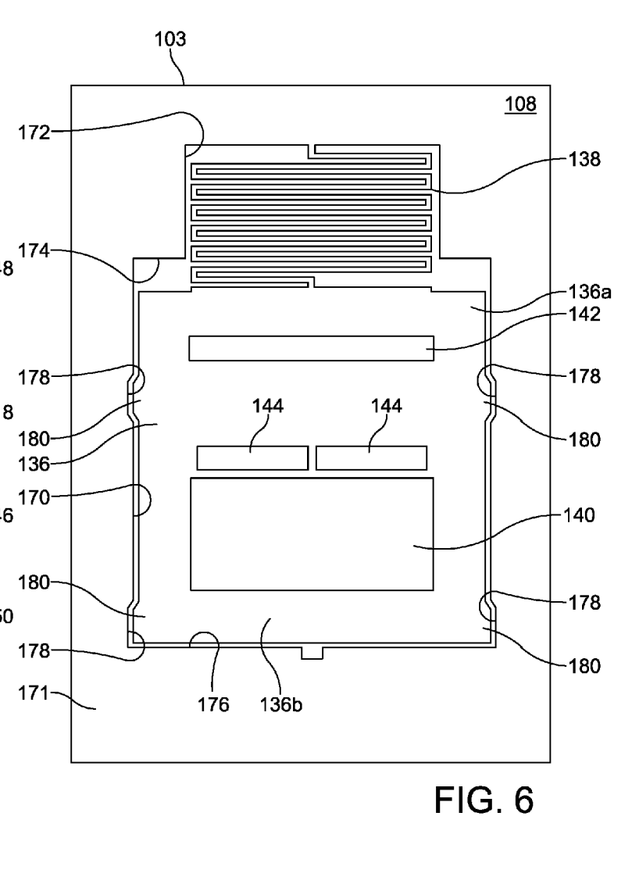
FIG. 6 is a plan view of a second surface of the intermediate plate illustrated in FIG. 4.

The structure of the intermediate plate 103 is illustrated in detail in FIGS. 4 and 6. As shown therein, a wide and preferably rectangular plate opening 170, and an adjacent and also preferably rectangular spring opening 172 are formed in the intermediate plate 103. The spring opening 172 is preferably narrower than the plate opening 170. The plate opening 170 and the spring opening 172 are in fluid communication with each other.

The plate opening 170 has a first end 174 which is adjacent and in fluid communication with the spring opening 172. The plate opening 170 also has a second end 176 opposite the first end 174. Each of the walls of the plate opening 170 that extend between the first end 174 and the second end 176 has a plurality of outwardly extending recesses 178 formed therein, the purpose of which will be described below.

The intermediate plate 103 further includes a displaceable member or plate 136 disposed in the plate opening 170 between the first and second ends 174 and 176 of the plate opening 170. The plate 136 is movable between a first position adjacent the second end 176 of the plate opening 170, as best shown in FIGS. 6, 10, and 11, and a second position adjacent the first end 174 of the plate opening 170, as best shown in FIG. 12.

The plate 136 is generally rectangular and has a first or command end 136a disposed nearest the first end 174 of the plate opening 170. The plate 136 has a second or reference end 136b disposed nearest the second end 176 of the plate opening 170.

The displaceable plate 136 has first and second fluid openings 140 and 142 formed therethrough. Balance ports 144 are also formed through the displaceable plate 136 adjacent the first fluid flow opening 140.

The plate 136 further has a plurality of protrusions 180 defined on side walls thereof that extend between the first end 136a and the second end 136b thereof. Each of the protrusions 180 is aligned with a corresponding one of the recesses 178 formed in the walls of the plate opening 170 when the plate 136 is in the first position. When the protrusions 180 are aligned with the recesses 178, a leak path between the protrusions 180 and the recesses 178 is minimized. The protrusions 180 are sufficiently shallow; i.e., have a minimal thickness, so as not to interfere with the travel of the plate 136 within the plate opening 170. However, when the plate 136 is out of the first position, the outwardly extending protrusions 180 on the plate 136 are no longer aligned with the corresponding outwardly extending recesses 178, and the protrusions 180 are closer and have a reduced clearance relative to the non-recessed portions of the walls of the plate opening 170.

The intermediate plate 103 also includes a convoluted spring 138, disposed in the spring opening 172. The convoluted spring 138 moveably connects the non-movable portion 171 of the intermediate plate 103 to the displaceable plate 136, and preferably biases the displaceable plate 136 to the first position. The convoluted spring 138 also retains the displaceable plate 136 in the plate opening 170, simplifying handling of the intermediate plate 103 during manufacture.

Figure 5:
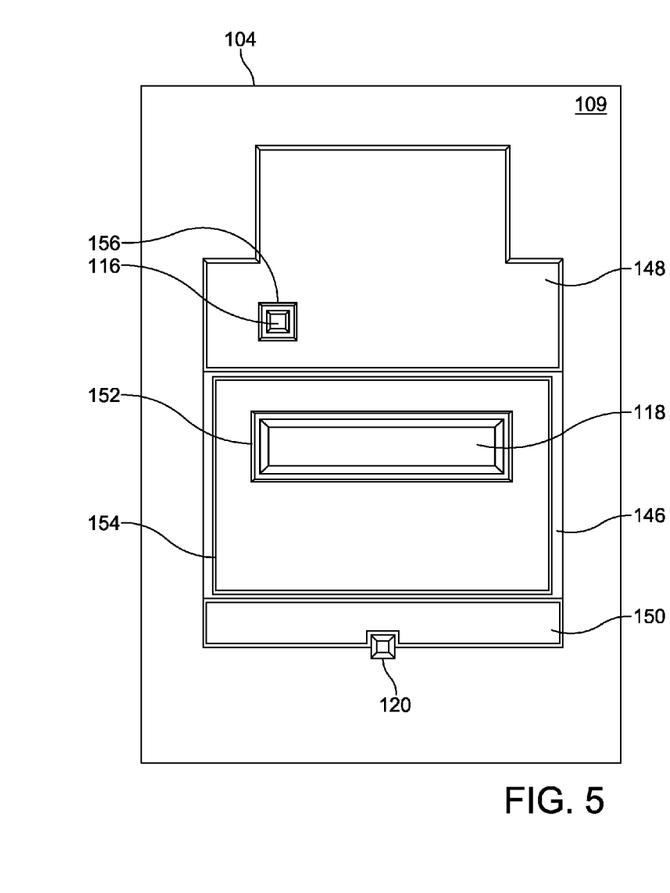
FIG. 5 is a plan view of an inner surface of the base plate illustrated in FIG. 4.

The structure of the inner surface 109 of the base plate 104 is illustrated in detail in FIG. 5. As shown therein, the base plate 104 includes a first recessed region 146, as second recessed region 148, and a third recessed region 150 provided on the inner surface 109 thereof. The pressure inlet port 118 is formed through the first recessed region 146, and the second feedback port 116 is formed through the second recessed region 148.

The base plate 104 also includes a first sealing structure 152 that extends from the bottom surface of the first recessed region 146 and completely about the perimeter of the pressure inlet valve port 118. A second sealing structure 154 also extends from the bottom surface of the first recessed region 146 and completely about a perimeter of the first recessed region 146. A third sealing structure 156 extends from the bottom surface of the second recessed region 148 and completely about the perimeter of the second feedback port 116.

In the illustrated embodiment, each of the sealing structures 152, 154, and 156 is a wall that is generally trapezoidal in cross-sectional shape and has the width W of about 70 μm at its top, as shown in FIG. 10. Alternatively, the width W may be within the range of from about 40 μm to 120 μm. Each of the sealing structures 152, 154, and 156 includes four linearly-extending wall segments that extend adjacent to the four sides of the pressure inlet valve port 118, the first recessed region 146, and the second feedback port 116, respectively. The sealing structures 152, 154, and 156 may however, be formed having any desired cross-sectional shape or combination of shapes, and may further extend in any desired manner (linearly or otherwise) about the pressure inlet valve port 118, the first recessed region 146, and the second feedback port 116. For example, the sealing structures 152, 154, and 156 may be formed substantially as shown in FIGS. 10 and 11, but may have rounded corners between adjacent linearly-extending wall segments, have one or more non-linearly-extending wall segments, or be entirely non-linear in shape.

A first space S3 is defined between bottom surfaces of the recessed regions 146, 148, and 150 of the base plate 104 and the second surface 108 of the displaceable plate 136 of the intermediate plate 103. A second space S4 is also defined between bottom surfaces of the recessed regions 122, 124, and 126 of the cover plate 102 and the first surface 107 of the displaceable plate 136 of the intermediate plate 103. The thickness of the first and second spaces S3 and S4 may be any desired value that is not likely to result in one or more particles (not shown) contained in fluid flowing through the first and second spaces S3 and S4 becoming jammed therein. For example, the thickness of the first and second spaces S3 and S4 may be approximately 50 μm.

Additionally, a relatively small third space S5 is defined between a top surface of the sealing structures 152, 154, and 156 of the base plate 104 and the second surface 108 of the displaceable plate 136 of the intermediate plate 103, and between a top surface of the sealing structures 130, 132, and 134 and the first surface 107 of the displaceable plate 136 of the intermediate plate 103. The thickness of the relatively small third space S5 may be any desired value that is not likely to result in excessive leakage as describe above. For example, the thickness of the relatively small third space S5 may be approximately 3 μm.

The operation of the pilot operated plate microvalve 100 described herein is similar to the pilot operated plate microvalves disclosed in U.S. Pat. No. 8,393,344 to Hunnicutt. U.S. Pat. No. 8,393,344 to Hunnicutt, the disclosure of which is incorporated herein in its entirety by reference, describes the structure and operation of a plurality of embodiments of known pilot operated plate microvalves.

During use, the microvalve 100 may be operated in a conventional manner (or otherwise) to selectively move the displaceable plate 136 between a first or closed position (illustrated in FIGS. 6, 10, and 11) and a second or open position (illustrated in FIG. 12). When the displaceable plate 136 is located in the closed position, it is desirable that as little fluid as possible flows between the pressure inlet port 118 and the pressure outlet port 114. This is accomplished by providing the first sealing structure 152 that extends from the bottom surface of the first recessed region 146 and completely about the perimeter of the pressure inlet valve port 118, and the second sealing structure 132 that extends from the bottom surface of the first recessed region 122 and completely about the perimeter of the first recessed region 122 wherein the pressure outlet port 114 is formed.

It is also desirable that as little fluid as possible flows between the pressure inlet for feedback port 116, first recessed region 146, pressure outlet for feedback port 112, and pressure equalization trough 128 and adjacent portions of the microvalve 100. This is accomplished by providing the sealing structures 156, 154, 134, and 130, respectively.

At the same time, the geometry of the microvalve 100 resists interference with the free movement of the displaceable plate 136 of the microvalve 100 that might otherwise result from the presence of particulate contaminants contained in the fluid flowing therethrough. This is accomplished by providing (1) the first space S3 between the first, second, and third recessed regions 146, 148, and 150, respectively, provided on the base plate 104 and the adjacent second surface 108 (the lower surface when viewing FIGS. 10 through 12) of the displaceable plate 136 and the convoluted spring 138, and (2) the second space S4 between the first, second, and third recessed regions 122, 124, and 126, respectively, provided on the cover plate 102 and the adjacent first surface 107 (the upper surface when viewing FIGS. 10 through 12) of the displaceable plate 136 and the convoluted spring 138. The relatively large thicknesses of the first and second spaces S3 and S4 is selected so as to prevent one or more particles (not shown) contained in the fluid moving through the microvalve 100 from becoming jammed therebetween, or at least to minimize the number of such particles that may become jammed therebetween.

The illustrated microvalve 100 is a proportionally controlled flow-through valve and may be actuated by a pilot valve, schematically illustrated at 160. The pilot valve may be any desired valve that supplies a command pressure to the control port 120, such as a microvalve or a standard-sized pilot valve. The pressure inlet valve port 118 and the pressure inlet for feedback port 116 are also in fluid communication with the pilot valve 160. The pilot valve 160 may be in fluid communication with a supply source 162, such as a pump, an accumulator, or any other device that provides pressurized fluid.

The pressure outlet port 114 and the pressure outlet for feedback port 112 are in fluid communication with a destination device 164, such as a fluid reservoir, a fluid accumulator, or an inlet of an evaporator in an HVAC-R system.

Fluid pressure at the control port 120 may at first urge the displaceable plate 136 against the force of the convoluted spring 138, but fluid entering the pressure inlet for feedback port 116 and through the second fluid opening 142 creates fluid pressure on the back side of the displaceable plate 136 and equalizes fluid pressure in the control port 120. The microvalve 100 may be moved to the open position shown in FIG. 12, when fluid pressure at the control port 120 exceeds the fluid pressure in the pressure inlet for feedback port 116 and exceeds the force of the convoluted spring 138, thereby causing the displaceable plate 136 to move to the open position (to the left when viewing FIGS. 10 and 12, wherein fluid may flow through the pressure inlet port 118, through the fluid flow opening 140, and through the pressure outlet port 114.

Advantageously, the combination of the sealing structures 130, 132, 134, 152, 154, and 156 allows for the placement of the first and second feedback ports 112 and 116 within the feedback regions 124 and 148, respectively. This structure eliminates the need for elongated feedback trenches, such as the elongated feedback trenches 47 and 57 in the known microvalve 10. Further, the combination of the sealing structures 130, 132, 134, 152, 154, and 156 and the elimination of the elongated feedback trenches 47 and 57 allows the plates 102, 103, and 104 of the improved microvalve 100 to be smaller than the corresponding plates 12, 14, and 16 of the known microvalve 10. The reduced size of the component plates 102, 103, and 104 also results in reduced contact surface area between the stationary plates 102 and 104 and the movable plate 103, further simplifying manufacture, and reducing cost of the microvalve 10. Further, because the microvalve 100 does not include the elongated feedback trenches 47 and 57 of the known microvalve 10, the number of steps necessary to produce the microvalve 100 may be reduced relative to the known microvalve 10, thereby further contributing to a reduction in cost of the microvalve 100.

The embodiment of the plate microvalve 100 of this invention illustrated in FIGS. 4 through 12 is packaged in a flow through configuration, wherein the pressure inlet port 118 and the pressure outlet port 114 are located on opposite sides of the microvalve 100. It will be understood however, that the improved sealing structures of this invention may be applied to plate valves having a conventional U-flow configuration, such as the plate valves disclosed in U.S. Pat. No. 8,393,344 to Hunnicutt, the disclosure of which is incorporated herein in its entirety by reference.

The principle and mode of operation of this invention have been explained and illustrated in its preferred embodiments. However, it must be understood that this invention may be practiced otherwise than as specifically explained and illustrated without departing from its spirit or scope.

What is claimed is:

1. A microvalve comprising:
   a first plate including a surface, a first recessed region provided within the surface, a first fluid port provided within the first recessed region, and a first sealing structure extending about the first fluid port, a second recessed region provided within the surface, a second fluid port provided within of the second recessed region, and a second sealing structure extending about the second fluid port, a third sealing structure extending from a bottom surface of one of the first and second recessed regions and about a perimeter of the one of the first and second recessed regions; and
   a second plate defining a non-movable portion and a movable portion, a surface of the non-movable portion abutting the surface of the first plate, the non-movable portion having first and second openings formed therethrough, the movable portion formed within the first opening and having an axis, the movable portion defining a displaceable member connected to the non-movable portion by a convoluted spring formed in a second opening, the displaceable member slidingly and axially movable within the first opening between a closed position, wherein the displaceable member cooperates with the sealing structure to prevent fluid communication through the fluid port, and an opened position, wherein the displaceable member does not cooperate with at least a portion of the sealing structure to prevent fluid communication through the fluid port.

2. The microvalve according to claim 1, wherein the microvalve is a flow through plate microvalve.

3. The microvalve according to claim 1, wherein the microvalve is a pilot operated plate microvalve.

4. The microvalve according to claim 1, wherein the microvalve has a U-flow configuration.

5. The microvalve according to claim 1, wherein a first space having a first thickness is defined between the displaceable member and the first recessed region of the first plate and a second space having a second thickness is defined between the displaceable member and the first sealing structure of the first plate, wherein the first thickness is greater than the second thickness.

6. The microvalve according to claim 1, wherein the second plate defines a plane, and wherein the displaceable member moves parallel to the plane when moved between the closed and opened positions.

7. The microvalve according to claim 1, wherein the displaceable member is configured as a plate having a fluid flow opening formed therethrough.

8. A microvalve comprising:
   a base plate including a surface, a first recessed region provided within the surface, a first fluid port provided within the first recessed region, and a first sealing structure extending about the first fluid port;
   a cover plate including a surface, a second recessed region provided within the surface, a second fluid port provided within the second recessed region, and a second sealing structure extending about the second fluid port;
   wherein a third fluid port is formed within a third recessed region provided within the surface of the base plate and a third sealing structure extends about the third fluid port, and wherein the cover plate further includes a fourth fluid port formed within a fourth recessed region provided within the surface of the cover plate and a fourth sealing structure extends about the fourth fluid port; and
   an intermediate plate defining a non-movable portion and a movable portion, a first surface of the non-movable portion abutting the surface of the base plate and a second surface of the non-movable portion abutting the surface of the cover plate, the non-movable portion having first and second openings formed therethrough, the movable portion formed within the first opening and having an axis, the movable portion defining a displaceable member connected to the non-movable portion by a convoluted spring formed in a second opening, the displaceable member slidingly and axially movable within the first opening between a closed position, wherein the displaceable member cooperates with at least one of the first and second sealing structures to prevent fluid communication between the first and second fluid ports, and an opened position, wherein the displaceable member does not cooperate with at least a portion of at least one of the first and second sealing structures to prevent fluid communication between the first and second fluid ports.

9. The microvalve according to claim 8, wherein the microvalve is a flow through plate microvalve.

10. The microvalve according to claim 8, wherein the microvalve is a pilot operated plate microvalve.

11. The microvalve according to claim 8, wherein the microvalve has a U-flow configuration.

12. The microvalve according to claim 8, wherein a first space having a first thickness is defined between the displaceable member and the first recessed region of the base plate and a second space having a second thickness is defined between the displaceable member and the first sealing structure of the base plate, wherein the first thickness is greater than the second thickness.

13. The microvalve according to claim 12, wherein a third space having the first thickness is defined between the displaceable member and the second recessed region of the cover plate and a fourth space having the second thickness is defined between the displaceable member and the second sealing structure of the cover plate.

14. The microvalve according to claim 8, wherein the intermediate plate defines a plane, and wherein the displaceable member moves parallel to the plane when moved between the closed and opened positions.

15. The microvalve according to claim 8, wherein the displaceable member is configured as a plate having a fluid flow opening formed therethrough.

16. The microvalve according to claim 8, further including a fifth sealing structure extending from a bottom surface of one of the first and third recessed regions and about a perimeter of the one of the first and third recessed regions.

17. The microvalve according to claim 16, further including a sixth sealing structure extending from a bottom surface of one of the second and fourth recessed regions and about a perimeter of the one of the second and fourth recessed regions.

\* \* \* \* \*